United States Patent
Seo et al.

(10) Patent No.: US 12,367,944 B2
(45) Date of Patent: Jul. 22, 2025

(54) MEMORY DEVICE INCLUDING TEST PAD CONNECTION CIRCUIT

(71) Applicant: Samsung Electronics Co., Ltd., Suwon-si (KR)

(72) Inventors: Chang-Wook Seo, Suwon-si (KR); Sangyong Yoon, Suwon-si (KR); Keeho Jung, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 99 days.

(21) Appl. No.: 18/341,192

(22) Filed: Jun. 26, 2023

(65) Prior Publication Data
US 2024/0145023 A1 May 2, 2024

(30) Foreign Application Priority Data
Nov. 1, 2022 (KR) .......................... 10-2022-0144034

(51) Int. Cl.
*G11C 29/12* (2006.01)
*G11C 29/46* (2006.01)

(52) U.S. Cl.
CPC .......... *G11C 29/46* (2013.01); *G11C 29/1201* (2013.01)

(58) Field of Classification Search
CPC .................................................... G11C 29/46
See application file for complete search history.

(56) References Cited

U.S. PATENT DOCUMENTS

| | | | | |
|---|---|---|---|---|
| 5,717,643 A | * | 2/1998 | Iwanami | G11C 29/38 365/201 |
| 5,864,510 A | | 1/1999 | Nakaoka | |
| 5,933,378 A | * | 8/1999 | Gans | G11C 5/146 365/201 |
| 7,642,803 B2 | | 1/2010 | Choi | |
| 7,707,467 B2 | | 4/2010 | Louie et al. | |
| 7,823,031 B2 | | 10/2010 | Kim et al. | |
| 7,831,405 B2 | | 11/2010 | Hur | |
| 7,949,923 B2 | * | 5/2011 | Park | G11C 29/06 714/720 |
| 9,824,946 B2 | | 11/2017 | Byun et al. | |
| 10,423,360 B2 | | 9/2019 | Kim et al. | |
| 11,293,972 B2 | | 4/2022 | Hyun et al. | |
| 11,435,397 B2 | | 9/2022 | Choi et al. | |
| 2008/0143396 A1 | * | 6/2008 | Nishida | H03L 7/091 327/146 |

FOREIGN PATENT DOCUMENTS

| | | |
|---|---|---|
| KR | 10-0515025 B1 | 12/2005 |
| KR | 10-2007-0082107 A | 8/2007 |

(Continued)

*Primary Examiner* — Mohammed A Bashar
(74) *Attorney, Agent, or Firm* — Harness, Dickey & Pierce, P.L.C.

(57) ABSTRACT

A memory device includes a test mode detector circuit that determines whether the memory device has entered a test mode based on at least one test mode entry signal received through at least one pin of a plurality of pins and generates a test mode detection signal, and a test pad connection circuit that electrically couples a first pin of the plurality of pins to a dedicated test pad of the test mode such that a signal applied to the first pin is transmitted to the dedicated test pad based on the test mode detection signal.

20 Claims, 17 Drawing Sheets

(56) References Cited

FOREIGN PATENT DOCUMENTS

| KR | 10-0842724 B1 | 7/2008 |
| KR | 10-0851994 B1 | 8/2008 |
| KR | 10-0891326 B1 | 3/2009 |
| KR | 10-2009-0098506 A | 9/2009 |
| KR | 10-1048606 B1 | 7/2011 |
| KR | 10-2018-0099266 A | 9/2018 |
| KR | 10-2020-0133631 A | 11/2020 |

* cited by examiner

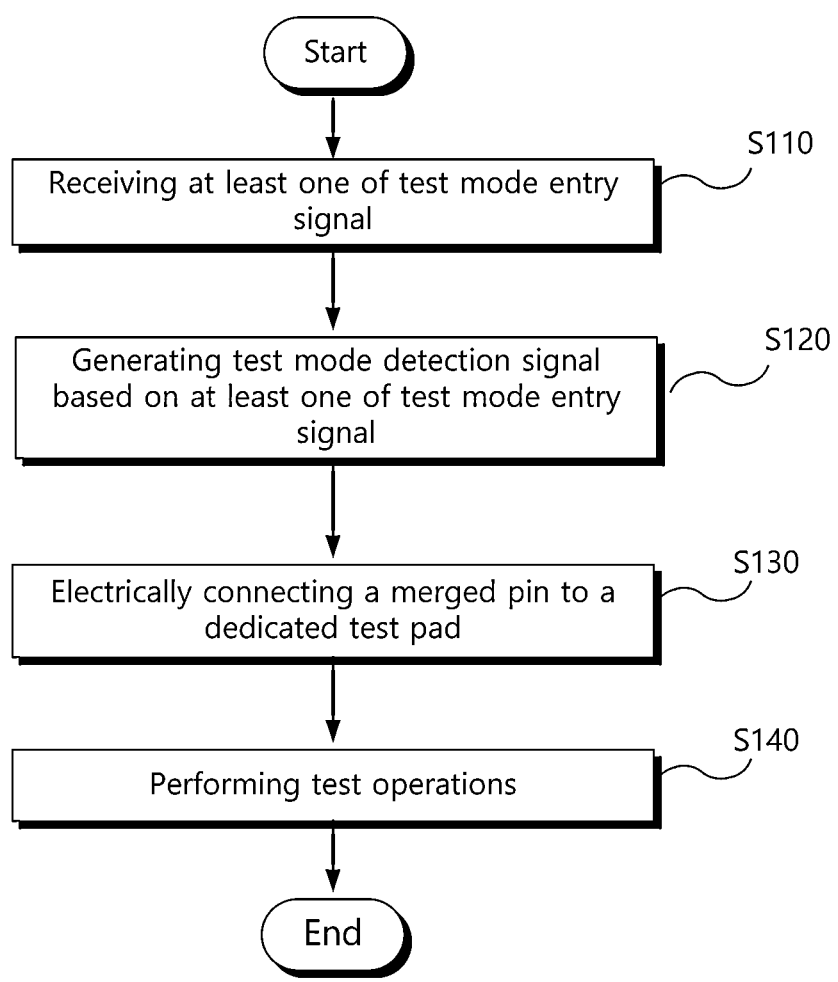

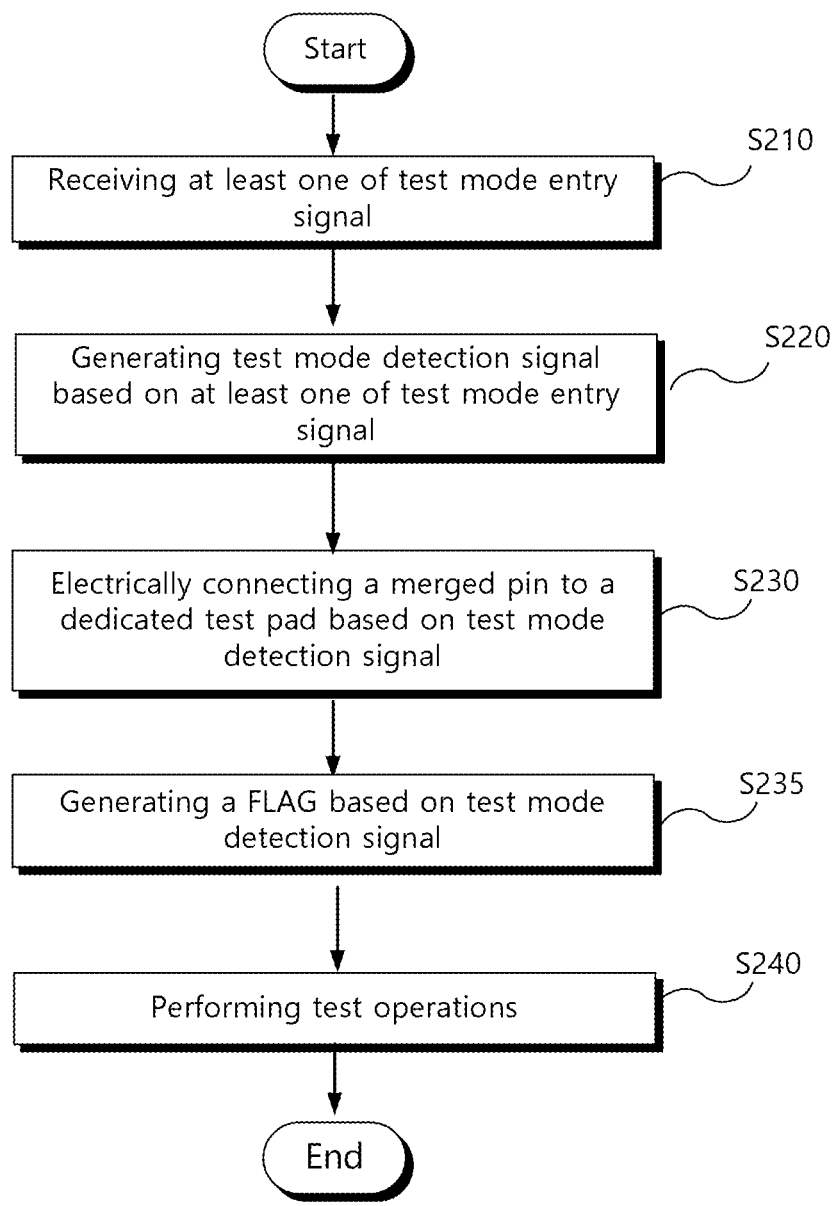

MEMORY DEVICE INCLUDING TEST PAD CONNECTION CIRCUIT

CROSS-REFERENCE TO RELATED APPLICATIONS

This application claims priority under 35 U.S.C. § 119 to Korean Patent Application No. 10-2022-0144034 filed on Nov. 1, 2022, in the Korean Intellectual Property Office, the disclosures of which is incorporated by reference herein in its entirety.

BACKGROUND

Various example embodiments described herein relate to a memory device, and more particularly, relate to a memory device and a test method performed in the memory device.

A test operation may be performed in various test modes to check whether a memory device operates as intended, e.g. based on expectations of a designer. For example, in a process of developing a memory device, a test operation may be performed on the memory device in a wafer state, and a test operation may be performed on the memory device for which a package process has been completed.

In general, a test environment for a memory device in a wafer state may be configured by electrically coupling an external test device to a dedicated test pad included in the memory device. A dedicated test pad may correspond to a specific test mode. That is, an external test device may request the memory device to execute a specific test mode through a dedicated test pad, and the memory device may execute the specific test mode in response to the request.

However, in the case of a memory device for which a packaging process is completed, the dedicated test pad is not exposed to the outside. For example, the dedicated test pad is covered with an insulating material through the packaging process and is not exposed to the outside. Accordingly, the external test device cannot be connected to the dedicated test pad, and thus the memory device cannot execute a specific test mode corresponding to the dedicated test pad.

SUMMARY

Various example embodiments provide a memory device capable of performing a test operation in a test mode corresponding to a dedicated test pad even when the dedicated test pad is not exposed to the outside of the memory device.

According to some example embodiment, a memory device includes a test mode detector circuit configured to determine whether the memory device has entered a test mode based on at least one test mode entry signal received through at least one pin of a plurality of pins and to generate a test mode detection signal; and a test pad connection circuit that electrically couples a first pin of the plurality of pins to a dedicated test pad of the memory device such that a signal applied to the first pin is transmitted to the dedicated test pad based on the test mode detection signal.

Alternatively or additionally, according to some example embodiments, a test method performed in a memory device includes receiving at least one test mode entry signal through at least one pin of a plurality of pins from an external test device, generating a test mode detection signal by determining whether the memory device has entered a test mode based on the at least one test mode entry signal, electrically coupling a dedicated test pad of the memory device to a first pin among the plurality of pins, based on the test mode detection signal, and performing a test operation corresponding to the test mode signal based on a test mode execution signal transmitted from the external test device to the dedicated test pad through the first pin.

Alternatively or additionally, according to some example embodiments, a semiconductor device includes processing circuitry configured to execute machine-readable instructions that, when executed by the processing circuitry, causes the memory device to whether the semiconductor device has entered a test mode based on at least one test mode entry signal received from the external test device through at least one of a plurality of pins of the memory device and to electrically couple a plurality of dedicated test pads corresponding to the test mode to corresponding pins among the plurality of pins, respectively in response to determining that the memory device has entered the test mode. The plurality of dedicated test pads may be covered by an insulating layer and are not exposed to outside of the memory device.

BRIEF DESCRIPTION OF THE FIGURES

The above and other objects and features will become apparent by describing in detail embodiments thereof with reference to the accompanying drawings.

FIG. 7 is a flowchart illustrating an example of an operation of the memory device of FIG. 5.

FIG. 10 is a flowchart illustrating an example of an operation of the memory device of FIG. 8.

DETAILED DESCRIPTION

Hereinafter, various example embodiments will be described clearly and in detail to the extent that those of ordinary skill in the art can easily practice the present disclosure.

Figure 1:
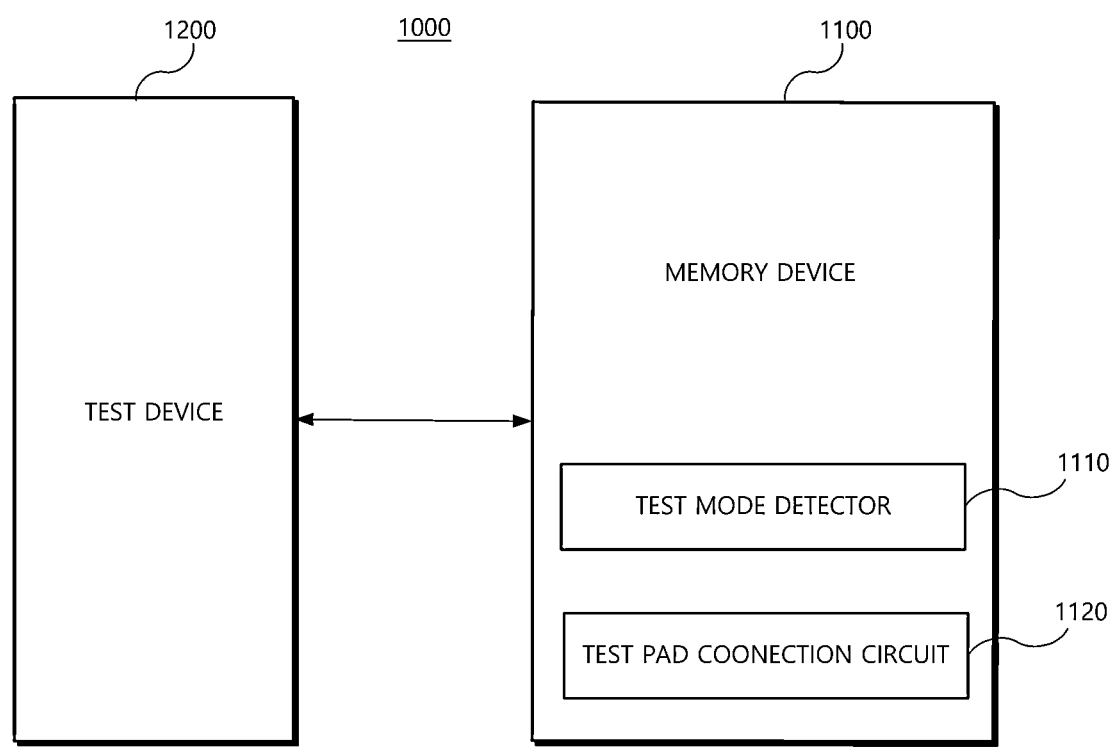
FIG. 1 is a diagram illustrating an example of a test environment according to various example embodiments.

FIG. 1 is a diagram illustrating an example of a test environment 1000 according to various example embodiments.

Referring to FIG. 1, the test environment 1000 may include a semiconductor device such as a memory device 1100 and an external test device 1200.

The test device 1200 may be or may include automated test equipment (ATE). The test device 1200 may perform a test operation on the memory device 1100. For example, the test device 1200 may apply various signals such as various voltages and/or currents, such as but not limited to various commands such as read and/or write commands, to the memory device 1100, and the memory device 1100 may output resultant values in response to the various signals. The test device 1200 may test one or more of performance such as timing and/or power performance, defects such as shorts and/or opens, or the like of the memory device 1100 based on the resultant values output from the memory device 1100. In some example embodiments, the test device 1200 may perform redundancy operations including but not limited to blowing of fuses and/or of anti-fuses; however, example embodiments are not limited thereto.

In some example embodiments, the test device 1200 may apply test signals for executing a specific test mode for the memory device 1100 to the memory device 1100. Here, the specific test mode may refer to a test mode to be performed through a dedicated test pad included in the memory device 1100. For example, the test signals may include one or more of a test mode entry signal used to enter a specific test mode corresponding to a dedicated test pad, a test mode execution signal used to execute the specific test mode, and the like. As will be described below, the test device 1200 may apply a signal and/or data to the memory device 1100 according to a pattern such as a dynamically determined pattern (or, alternatively, a predetermined pattern) to request the memory device 1100 to enter a specific test mode corresponding to a dedicated test pad. In some example embodiments, there may be a relationship, such as a one-to-one relationship, or a many-to-one relationship, or a one-to-many relationship, or a many-to-many relationship between specific test modes and specific test pads.

The memory device 1100 may receive various signals from an external device such as the test device 1200 through a plurality of pins and/or may output various signals to the external device. The plurality of pins may include a plurality of control pins and one or more or a plurality of data input/output pins, and the plurality of pins may also be referred to as a plurality of user pins. For example, the memory device 1100 may receive a control signal for controlling an operation of the memory device 1100 through a plurality of control pins. Also, the memory device 1100 may receive and/or output one or more of commands, addresses, and page data through data input/output pins.

The plurality of control pins and the data input/output pins may be exposed to the outside of the memory device 1100. Here, being exposed to the outside may indicate a state capable of receiving, e.g. of directly receiving a signal from the outside through a corresponding pin. For example, connection terminals or pads may be formed on the surface of the memory device 1100, and an external signal may be directly received by connecting a corresponding pin to the pad. The plurality of control pins and/or the plurality of data input/output pins may have the shape of a pin, but are not limited thereto. For example, the plurality of control pins and the data input/output pins may have the shape of a pad or ball.

The memory device 1100 may include a dedicated test pad. The dedicated test pad may correspond to or be associated with a specific test mode for efficiently performing a test operation. For example, the dedicated test pad may correspond to a pin-reduction test mode in which a test operation is performed by reducing the number of pins. However, the specific test mode corresponding to the dedicated test pad according to the present disclosure is not limited thereto. For example, alternatively or additionally the specific test mode corresponding to the dedicated test pad may include a test mode related to whether data input/output is normally performed, a test mode related to voltage input/output characteristics or current input/output characteristics, a test mode for determining defects of the memory device 1100, and the like. On the other hand, when the different test modes are applied despite the same test operation, the test operation may be performed in different ways.

The dedicated test pad of the memory device 1100 may not be exposed to the outside. For example, the packaging process of the memory device 1100 has been completed, and the dedicated test pad may be isolated from the outside by an insulating material. However, it is not limited thereto, and the memory device 1100 may be of a wafer level, and the dedicated test pad may not be exposed to the outside of the wafer level of the memory device 1100.

In various example embodiments, the memory device 1100 may determine whether the specific test mode corresponding to the dedicated test pad has been entered based on the pattern, e.g. the logical pattern or the logical test vector, of signals and/or data received through at least one of a plurality of pins. In some example embodiments, when the pattern or test vector of the received signals indicates a test mode entry signal, the memory device 1100 may couple or assign one of a plurality of pins to a dedicated test pad. Thereafter, the memory device 1100 may receive a test mode execution signal through a pin coupled to the dedicated test pad. Accordingly, even when the dedicated test pad is not exposed to the outside, the memory device 1100 may perform the specific test mode corresponding to the dedicated test pad.

In general, in order to enter a specific test mode, it may be necessary or desirable to receive a related signal directly through the dedicated test pad. For example, a signal applied to the dedicated test pad needs to be transferred to a circuit performing a specific test mode through an output line of the dedicated test pad. When it is difficult to directly receive a signal from an external test device because the dedicated test pad of the memory device is not exposed to the outside, the memory device is unable or unlikely to be able to execute a specific test mode corresponding to the dedicated test pad therein, resulting in an inefficient test operation.

However, the memory device 1100 according to various example embodiments may enter a specific test mode based on the pattern or test vector of signals and/or data received through at least one of a plurality of pins even when a dedicated test pad is not exposed. Alternatively or additionally, when the entry of the memory device into the test mode is detected, one of a plurality of pins may be coupled to the dedicated test pad, e.g. a dynamically determined (or, alternatively, predetermined) one of the plurality of exposed pins may act as though the one of the plurality of exposed pins were the unexposed pin. Thereafter, a test mode execution signal may be received through a pin coupled to the dedicated test pad. Accordingly, even when the dedicated test pad is not exposed to the outside, the memory device 1100 may perform the specific test mode corresponding to the dedicated test pad.

To this end, the memory device 1100 may include a test mode detector circuit, e.g. a test mode detector 1110 and a test pad connection circuit 1120.

The test mode detector 1110 may determine whether a test mode corresponding to a dedicated test pad has been entered based on a signal received through at least one of a plurality of pins. For example, the test mode detector 1110 may detect a pattern of signals such as a test vector received through at least one of a plurality of pins, and when the detected pattern is identical to a pattern, such as a dynamically determined (or, alternatively, a predetermined) pattern, determine to enter a test mode corresponding to the pattern.

For example, when the number of times of toggling of a signal received through a pin exposed to the outside is equal to a particular number such as a dynamically or preset number, the test mode detector 1110 may determine to enter the test mode corresponding to the dedicated test pad of the memory device 1100.

Alternatively or additionally, when a combination of a pattern of a signal applied through at least one of the plurality of control pins and a pattern of data applied through at least one of the plurality of data pins is identical to a dynamically determined (or, predetermined) combination of signals and data, the test mode detector 1110 may determine to enter a test mode corresponding to a dedicated test pad of the memory device 1100.

The test mode detector 1110 may output a test mode detection signal when the test mode detector 1110 is determined that the memory device 1100 has entered the test mode.

When the test mode detector 1110 determines that the memory device 1100 has entered the test mode, the test pad connection circuit 1120 may electrically couple a dedicated test pad to one of the plurality of pins. For example, the test pad connection circuit 1120 may electrically couple the dedicated test pad to one of the plurality of pins in response to the test mode detection signal received from the test mode detector 1110.

After the dedicated test pad has been coupled to one of the plurality of pins, the external test device 1200 may apply a test mode execution signal to the pin coupled to the dedicated test pad. Accordingly, the test mode execution signal may be transmitted to an output line of the dedicated test pad and transmitted to a circuit that performs the test mode through the output line, so that the test mode may be executed. Accordingly, even when the dedicated test pad is not exposed to the outside of the memory device 1100, the specific test mode corresponding to the dedicated test pad may be executed.

As described above, the memory device 1100 according to various example embodiments may include a dedicated test pad which is not exposed to the outside. Therefore, the test mode entry signal may not be directly applied to the dedicated test pad. Under this circumstance, the memory device 1100 according to various example embodiments may determine whether a specific test mode has been entered based on a pattern of signals and/or data received through at least one of a plurality of pins, and may couple one of the plurality of pins to the dedicated test pad when the entry into the test mode is detected. Accordingly, even when the dedicated test pad is not exposed to the outside, the memory device 1100 may perform the specific test mode corresponding to the dedicated test pad.

Figure 2:
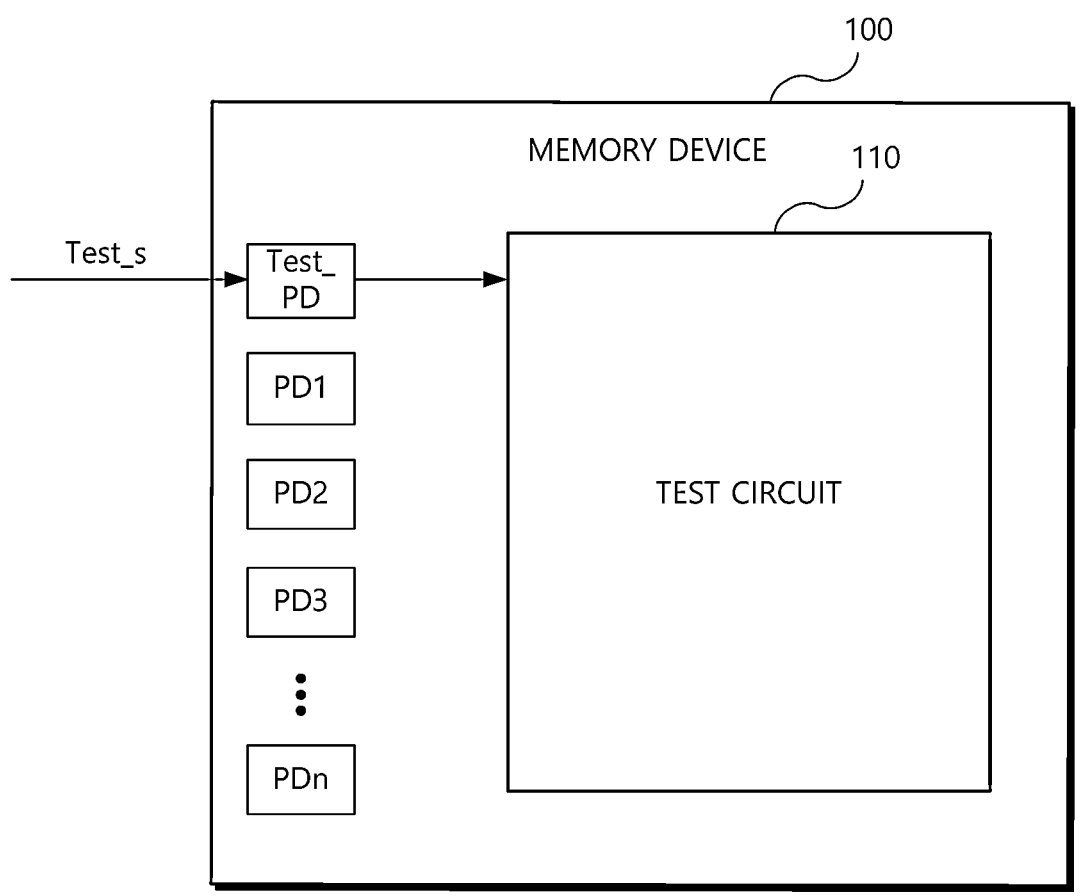
FIG. 2 is a diagram illustrating an example in which a dedicated test pad is exposed to the outside of a memory device.

FIG. 2 is a diagram illustrating an example in which a dedicated test pad is exposed to the outside of a memory device 100.

A test operation of the memory device 100 may be performed through various test modes. For example, a test operation may be performed on the memory device 100 in various test modes for the purpose of analyzing whether the memory device 100 has defects or the purpose of testing whether the memory device 100 operates as intended by a designer.

To perform a specific test mode, the memory device 100 may include a dedicated test pad Test_PD corresponding to the specific test mode. Also, the memory device may include a plurality of pads PD1 to PDn for receiving control signals and/or data for controlling the operation of the memory device.

In FIG. 2, the dedicated test pad Test_PD and the plurality of pads PD are exposed to the outside of the memory device 100. Here, being exposed to the outside may correspond to a state capable of directly receiving a signal from the outside through a corresponding pad. For example, the memory device 100 of FIG. 2 may be of a wafer level before the packaging process has been completed.

The external test device may directly apply a test signal Test_s to the dedicated test pad Test_PD through a probe pin and/or the like. The test signal Test_s may include a test mode entry signal used to enter a specific test mode corresponding to a dedicated test pad, a test mode execution signal used to execute the specific test mode, and the like.

The memory device 100 may include a test circuit 110. The test circuit 110 may detect whether a specific test mode is entered based on the test signal Test_s received through the dedicated test pad Test_PD. When the memory device 100 enters the specific test mode, the test circuit 110 may perform a test operation according to the test mode based on the test signal Test_s received through the dedicated test pad Test_PD.

In this way, when the dedicated test pad Test_PD is exposed to the outside, the specific test mode may be executed based on the test signal Test_s received through the dedicated test pad.

Figure 3A:
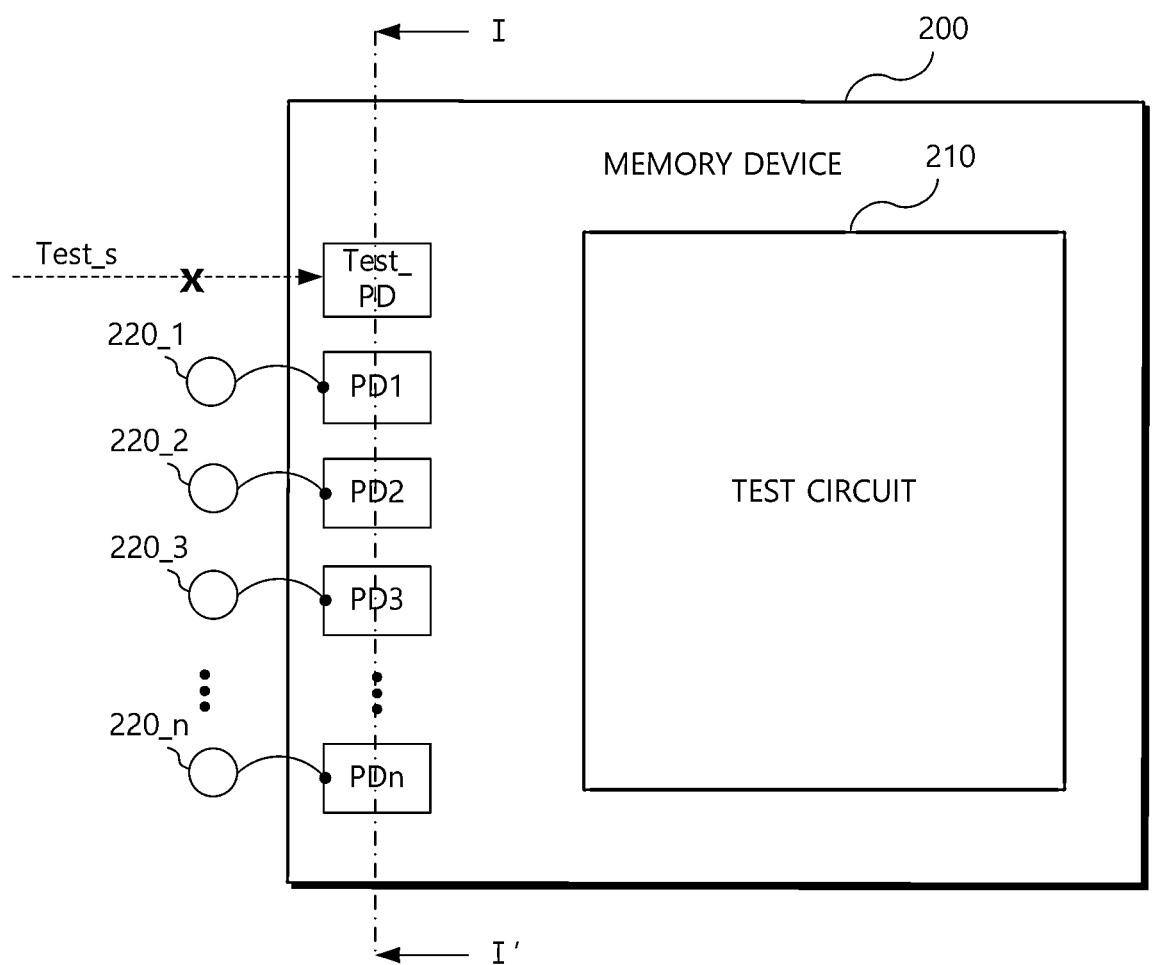
FIG. 3A is a diagram illustrating an example in which a dedicated test pad is not exposed to the outside of a memory device.
Figure 3B:
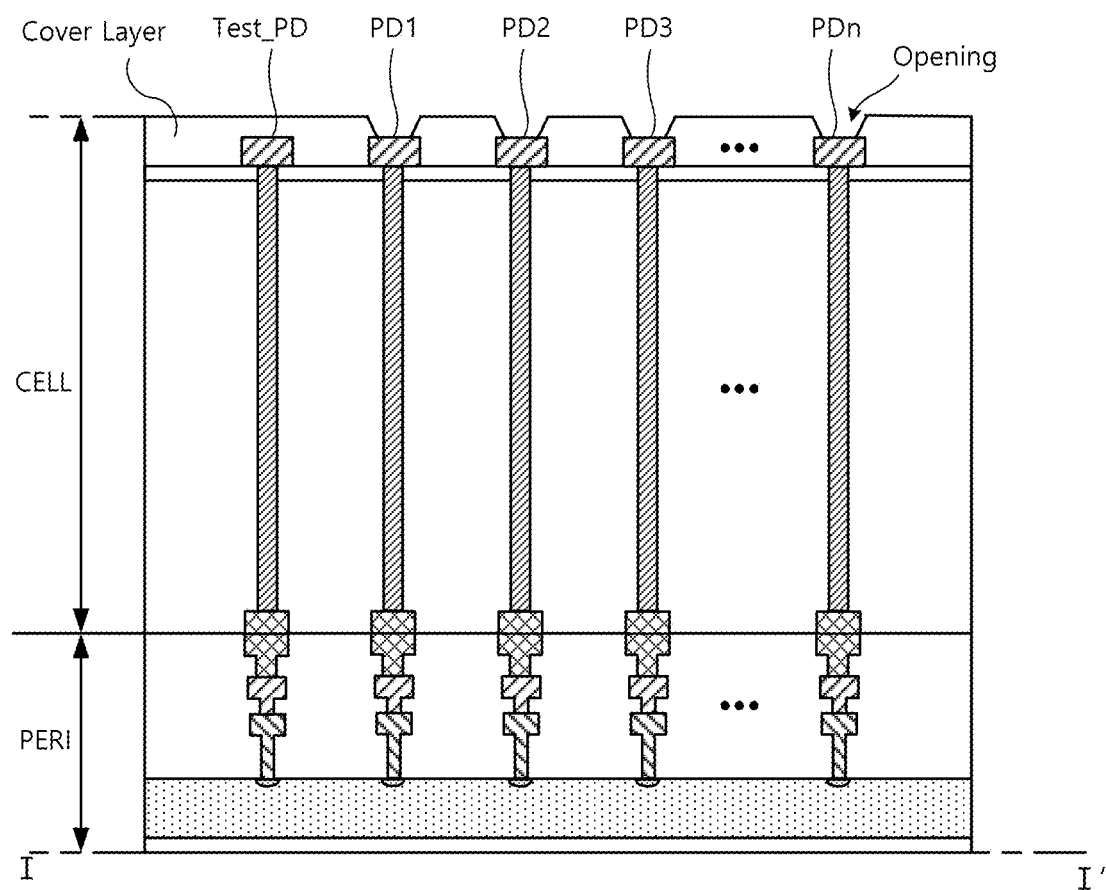
FIG. 3B is a diagram illustrating an example of a cross section of the memory device of FIG. 3A taken along the line I-I".

FIG. 3A is a diagram illustrating an example in which a dedicated test pad is not exposed to the outside of a memory device 200. FIG. 3B is a diagram illustrating an example of a cross section of the memory device 200 of FIG. 3A taken along the line I-I".

The memory device 200 of FIG. 3A may be or may correspond to a memory device for which a packaging process for the memory device 100 of FIG. 2 has been completed, and may be a package level of memory device. Similar to FIG. 2, the memory device 200 of FIG. 3A may include the dedicated test pad Test_PD corresponding to a specific test mode and the plurality of pads PD1 to PDn.

As illustrated in FIGS. 3A and 3B, in the case of the memory device 200 for which the packaging process has been completed, the plurality of pads PD1 to PDn may be coupled to external connection terminals by bonding wires. For example, the plurality of pads PD1 to PDn are exposed to the outside through openings, and the plurality of pads PD1 to PDn exposed to the outside may be electrically coupled to a plurality of pins 220_1 to 220_n. The memory device 200 may receive signals from an external device through the plurality of pins 220_1 to 220_n and perform read/write operations, and the like.

However, as shown in FIG. 3B, the dedicated test pad Test_PD may be isolated from the outside by a cover layer made of an insulating material. Therefore, the dedicated test pad Test_PD is not coupled to an external connection terminal such as a bonding wire. Accordingly, in the memory device 200 of FIGS. 3A and 3B, the test signal Test_s may be unable to be applied to the dedicated test pad Test_PD, and a specific test mode corresponding to the dedicated test pad Test_PD is unable to be performed. Cell region CELL and peripheral region PERI may be included in the memory device of FIG. 3B.

Figure 4:
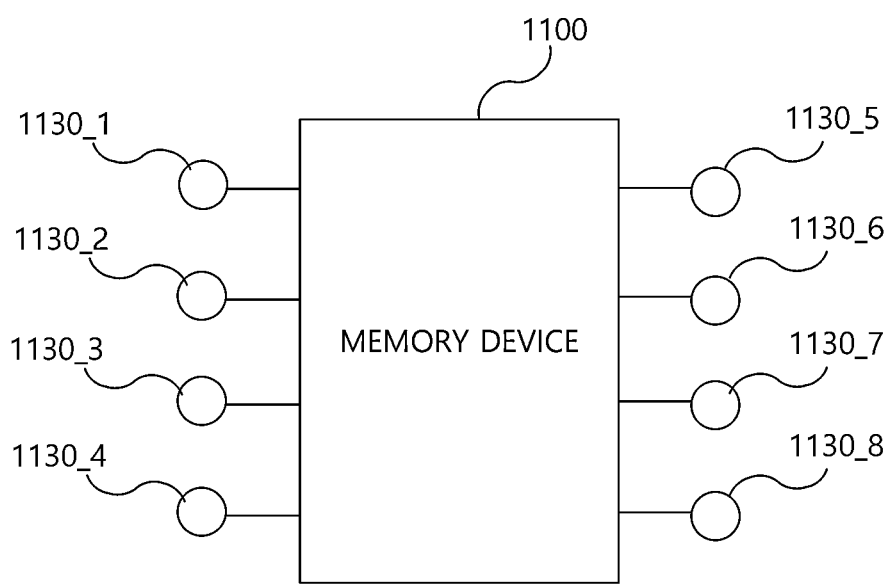
FIG. 4 is a diagram illustrating an example of a pin configuration of a memory device according to various example embodiments.

FIG. 4 is a diagram illustrating an example of a pin configuration of the memory device 1100 according to various example embodiments. For convenience of description, in FIG. 4, it is assumed that the memory device 1100 has eight pins.

Referring to FIG. 4, the memory device 1100 may receive signals from an external device or output signals to the external device, through a plurality of pins 1130_1 to 1130_8. Here, the external device may be a test device, a memory controller, or a host.

The memory device 1100 may include a number of pins, such as the first to eighth pins 1130_1 to 1130_8. In some example embodiments, the first to seventh pins may be control pins, and the eighth pin may be a data input/output pin; however, example embodiments are not limited thereto. In this case, the memory device 1100 may receive control signals for controlling the operation of the memory device 1100 through the first to seventh pins 1130_1 to 1130_7. The memory device 1100 may receive and/or output one or more of commands, addresses, and data through the eighth pin 1130_8.

For example, the memory device 1100 may receive a Chip Enable (CE) signal through the first pin 1130_1. The first pin 1130_1 may also be referred to as a CE pin.

For example, the memory device 1100 may receive a command latch enable (CLE) signal through the second pin 1130_2. The second pin 1130_2 may be referred to as a CLE pin.

For example, the memory device 1100 may receive an address latch enable (ALE) signal through the third pin 1130_3. The third pin 1130_3 may be referred to as an ALE pin. The memory device 1100 may identify the type of a signal (e.g., command, address, or data) received through the eighth pin 1130_8, which corresponds to the data input/output pin, based on signals input to the second pin 1130_2 and the third pin 1130_3.

For example, the memory device 1100 may receive a write enable (WE) signal through the fourth pin 1130_4 and a read enable (RE) signal through the fifth pin 1130_5. The fourth pin 1130_4 and the fifth pin 1130_5 may be referred to as a WE pin and a RE pin, respectively.

For example, the memory device 1100 may receive a write protection (WP) signal through the sixth pin 1130_6 and a ready/busy signal through the seventh pin 1130_7. The sixth 1130_6 pin and the seventh pin 1130_7 may be referred to as a WP pin and a Ready/Busy pin, respectively.

In the memory device 1100 according to various example embodiments, one of, e.g. precisely one of, the plurality of pins 1130_1 to 1130_8 may be electrically coupled to a dedicated test pad inside the memory device 1100. For example, at least one of the plurality of pins 1130_1 to 1130_8 may be coupled to one end of a test pad connection circuit inside the memory device 1100 in advance, as described below. In this case, the corresponding pin may be coupled to a dedicated test pad through the test pad connection circuit. Accordingly, even when the dedicated test pad is not exposed to the outside of the memory device 1100 (e.g. after packaging), a specific test mode corresponding to the dedicated test pad may be executed.

Meanwhile, the configuration of the plurality of pins and the control signal received through the plurality of pins, which are described with reference to FIG. 4, are merely example embodiments, but are not limited thereto. For example, although eight pins are shown in FIG. 4, the number of pins may vary, and/or a control signal different from the control signals described above may be received.

Figure 5:
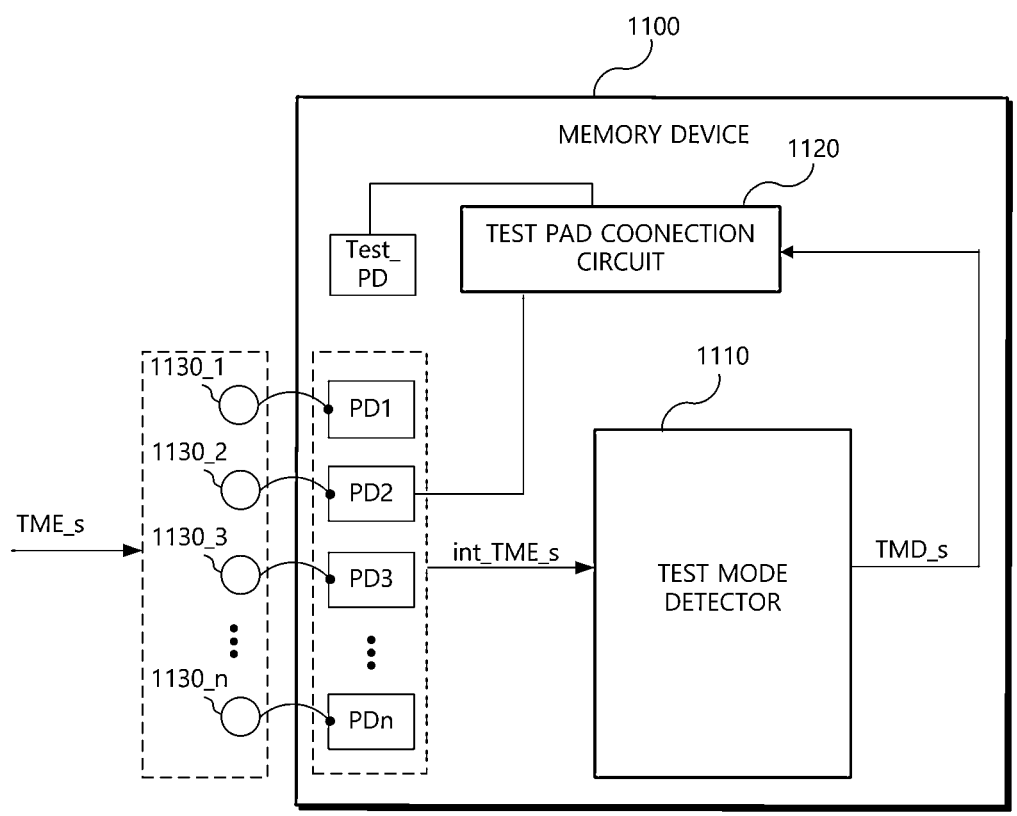
FIG. 5 is a diagram illustrating a memory device according to various example embodiments in more detail.

FIG. 5 is a diagram illustrating the memory device 1100 according to various example embodiments in more detail. For convenience of description, FIG. 5 shows only a configuration for detecting whether a specific test mode corresponding to a dedicated test pad is entered, and other configurations will be omitted for brief description.

Referring to FIG. 5, the memory device 1100 may include the test mode detector 1110 and the test pad connection circuit 1120.

The memory device 1100 may receive signals from an external device through a plurality of pins 1130_1 to 1130_n. The plurality of pins 1130_1 to 1130_n may include a plurality of control pins and/or at least one data input/output pin. A control signal for controlling the operation of the memory device 1100 may be received from an external device through the plurality of control pins. Signals corresponding to commands and/or addresses and/or data may be received through the data input/output pin. In some example embodiments, the plurality of pins 1130_1 to 1130_n may include the first to eighth pins 1130_1 to 1130_8 as shown in FIG. 4.

The memory device 1100 may receive a test mode entry signal TME_s from an external test device through the plurality of pins 1130_1 to 1130_n. The test mode entry signal TME_s may be a signal used for the memory device 1100 to enter a specific test mode corresponding to a dedicated test pad. Referring to FIG. 5, the test mode entry signal TME_s applied to the plurality of pins 1130_1 to 1130_n may be transmitted to internal pads PD1 to PDn. The internal pads PD1 to PDn may transmit the received test mode entry signal TME_s to the test mode detector 1110 as an internal test mode entry signal int_TME_s. In this case, the test mode entry signal TME_s and the internal test mode entry signal int_TME_s may be substantially the same.

The test mode detector 1110 may determine whether the memory device 1100 has entered the specific test mode based on the test mode entry signal TME_s. For example, the test mode detector 1110 may determine whether a specific test mode corresponding to the dedicated test pad Test_PD of the memory device 1100 has been entered based on the number of times of toggling of the test mode entry signal TME_s. In this case, the test mode detector 1110 may include a counter for counting the number of times of toggling of the test mode entry signal TME_s.

In some example embodiments, the test mode detector 1110 may determine whether the number of times of toggling of the test mode entry signal TME_s input to one control pin among the plurality of pins 1130_1 to 1130_n is equal to a number "n" such as a dynamically determined (or, alternatively, preset determined number (here, n is a natural number greater than or equal to zero, or greater than or equal to one)) and determine whether the specific test mode corresponding to the dedicated test pad Test_PD has been entered based on a result of the determination.

In some example embodiments, the test mode detector 1110 may identify the numbers of toggles of two test mode entry signals TME_s respectively input to two control pins among the plurality of pins 1130_1 to 1130_n, and may determine whether the numbers of toggles are respectively equal to a preset number "m" (m is a natural number) and a preset number m' (m' is a natural number greater than or equal to zero, or greater than or equal to one). The test mode detector 1110 may determine whether a specific test mode corresponding to the dedicated test pad Test_PD has been entered based on a result of the determination. In this case, "m" and m' may be the same or may be different.

In some example embodiments, the test mode detector 1110 may determine whether the number of times of toggling of the test mode entry signal TME_s applied to at least one control pin among the plurality of pins 1130_1 to 1130_n is equal to a number "n", and identify the pattern of data input through the data input/output pin. The test mode detector 1110 may determine whether the test mode has been entered based on the number of times of toggling of the test mode entry signal TME_s and the pattern of the data. For example, the pattern of the data may be a combination of lower 4 bits of data input through the data input/output pin.

The test mode detector 1110 may output a test mode detection signal TMD_s when the test mode detector 1110 determines that the memory device 1100 has entered a specific test mode. The test mode detection signal TMD_s may be transmitted to the test pad connection circuit 1120.

When the test mode detection signal TMD_s is received from the test mode detector 1110, the test pad connection circuit 1120 may electrically couple or electrically assign the dedicated test pad Test_PD corresponding to the specific test mode to a first pin, which is one particular (or, predetermined) pin among the plurality of pins 1130_1 to 1130_n. Here, it is noted that the 'predetermined first pin' is a term used to refer to one predetermined pin and does not necessarily refer to the first pin of FIG. 4. The particular pin may be one control pin predetermined to be coupled to the dedicated test pad Test_PD among the plurality of pins 1130_1 to 1130_n. The one particular pin may be referred to as a merged pin in the sense that the one particular pin is coupled to the dedicated test pad Test_PD. For example, the merged pin may be one particular pin among remaining pins other than the first pin 1130_1 (that is, CE pin) and the eighth pin 1130_8 (that is, data input/output pin) in FIG. 4. For example, the merged pin may be one of the second to seventh pins 1130_2 to 1130_7 in FIG. 4, and is illustrated as being the second pin 1130_2 in FIG. 5; however, this is for illustrative purposes only, and example embodiments are not limited thereto.

In some example embodiments, the merged pin may be the same as the control pin to which the test mode entry signal TME_s is applied. In some example embodiments, the merged pin may be different from the control pin to which the test mode entry signal TME_s is applied.

In some example embodiments, the test pad connection circuit 1120 may include a transistor circuit such as a three-terminal transistor circuit (not shown). One end of the transistor circuit may be coupled to a pad connected to the merged pin, another end may be coupled to an output line of the dedicated test pad Test_PD, and a gate may receive the test mode detection signal TMD_s.

In some example embodiments, the test pad connection circuit 1120 may implemented in the form of a multiplexer (MUX) switch (not shown) that selectively transfers a signal received from the merged pin to the output line of the dedicated test pad Test_PD based on the test mode detection signal TMD_s. However, the configuration of the test pad connection circuit 1120 is not limited thereto, and the test pad connection circuit 1120 is able to be implemented by other configurations that perform a function of electrically coupling the merged pin to the dedicated test pad Test_PD.

After the dedicated test pad Test_PD is electrically coupled to the merged pin among the plurality of pins 1130_1 to 1130_n, a test mode execution signal may be received from the test device through the merged pin. The received test mode execution signal may be transferred to the dedicated test pad Test_PD and may be transferred to a circuit that performs a test operation through the output line of the dedicated test pad Test_PD. For example, the test mode execution signal may be synchronized with a clock signal transferred to the test pad connection circuit 1120 and transferred to the dedicated test pad Test_PD.

Accordingly, even when the dedicated test pad Test_PD is not exposed to the outside of the memory device 1100, the specific test mode corresponding to or using or intending to use the dedicated test pad may be performed.

Figure 6A:
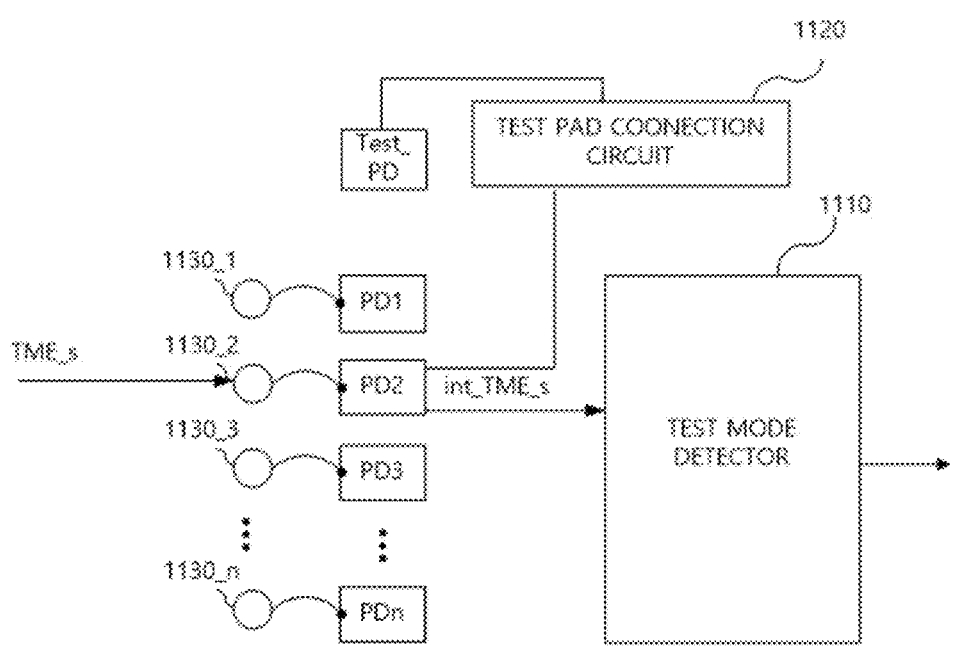
FIGS. 6A, 6B, and 6C are diagrams for describing an operation of the test mode detector of FIG. 4 in more detail.
Figure 6B:
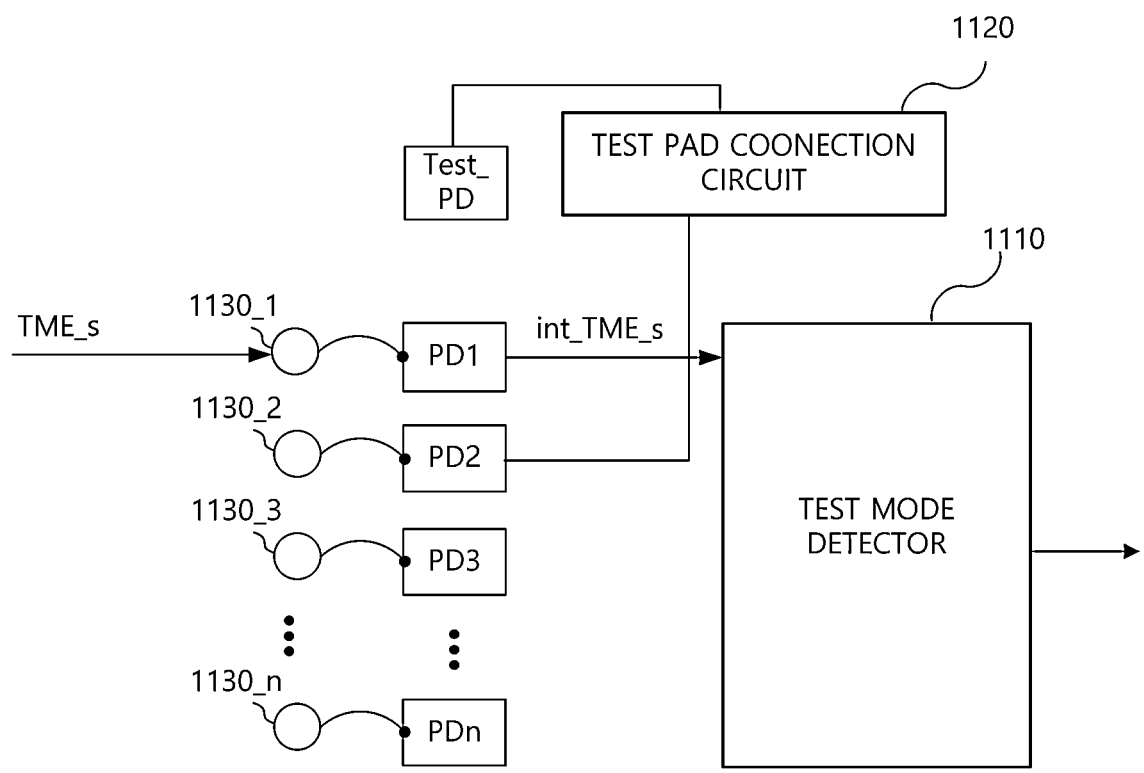
Figure 6C:
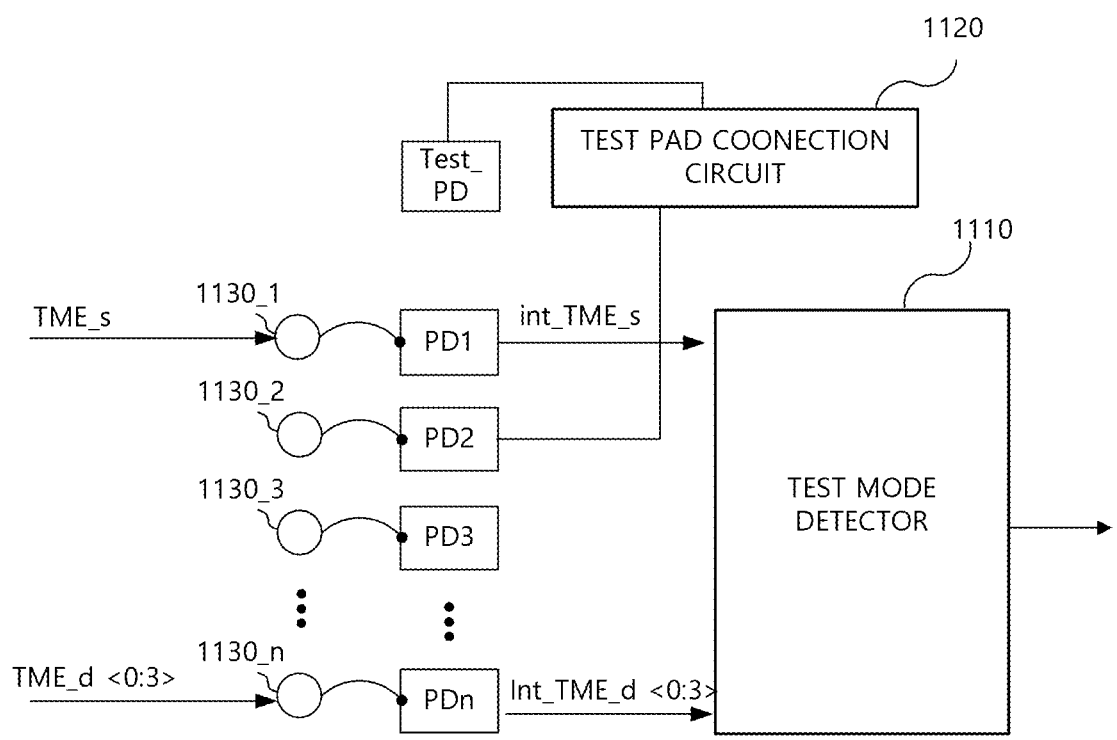

FIGS. 6A, 6B, and 6C are diagrams for describing an operation of the test mode detector of FIG. 4 in more detail. FIGS. 6A and 6B illustrate various example embodiments in which a test mode detector determines whether a memory device has entered a specific test mode based on a test mode entry signal input to at least one control pin. FIG. 6C illustrates various example embodiments in which the test mode detector determines whether the test mode has entered based on a test mode entry signal as well as a data pattern input to a data input/output pin.

First, referring to FIG. 6A, the test mode detector 1110 may receive the test mode entry signal TME_s through the merged pin 1130_2 configured to be coupled to the dedicated test pad Test_PD by the test pad connection circuit 1120 among the plurality of pins 1130_1 to 1130_n and determine whether a specific test mode has been entered based on the test mode entry signal TME_s.

The plurality of pins 1130_1 to 1130_n of FIG. 6A may include the first to eighth pins 1130_1 to 1130_8 shown in FIG. 4, and the merged pin 1130_2 may be a particular (or, predetermined) pin among remaining pins other than the CE pin and the data input/output pin. For example, the merged pin 1130_2 may be one of the second to seventh pins 1130_2 to 1130_7 of FIG. 4, and is illustrated as being the second pin 1130_2 in FIG. 6A.

The merged pin 1130_2 is a pin to which a test mode execution signal related to the test mode execution is applied after the memory device had entered the test mode, and is an essential pin when implementing a test environment. Therefore, when not only the test mode execution signal but also the test mode entry signal TME_s for determining whether the test mode has been entered are received through the merged pin 1130_2, it may be possible to reduce the number of pins which is used during the test because there is no need or expectation to use an additional (e.g. an exposed) pin.

Referring to FIG. 6B, the test mode detector 1110 may receive the test mode entry signal TME_s through one control pin 1130_1 of the plurality of pins 1130_1 to 1130_n other than the merged pin 1130_2, and determine whether the test mode has been entered based on the test mode entry signal TME_s.

In some example embodiments, the control pin 1130_1 may be a CE pin. The CE pin may be used to apply a control signal such as a mode reset signal when the memory device executes a specific test mode after having entered a test mode, and is an essential pin when implementing a test environment. Therefore, when the test mode entry signal TME_s is received through the CE pin, it is possible to reduce the number of pins used during execution of the test because there is no need or expectations to use additional pins.

Meanwhile, in various example embodiments of FIGS. 6A and 6B, it has been described that the test mode entry signal TME_s is input to one control pin. However, this is just an example, and different test mode entry signals TME_s may be applied to two or more control pins. In this case, the test mode detector 1110 may determine whether a specific test mode has been entered by using the number of times of toggling of each test mode entry signal TME_s.

Referring to FIG. 6C, the test mode detector 1110 may determine whether a specific test mode has been entered based on the test mode entry signal TME_s applied to one control pin 1130_1 among the plurality of pins 1130_1 to 1130_$n$ and the pattern of data input through the data input/output pin 1130_$n$ among the plurality of pins 1130_1 to 1130_$n$. Here, the pattern of data may be a value of a series of data received through the data input/output pin and may be, for example, a data value of lower 4 bits of data (TME_d<0:3>).

Meanwhile, it is illustrated in FIG. 6C that the control pin to which the test mode entry signal TME_s is applied is the CE pin 1130_1, but the present disclosure is not limited thereto.

As described above, the test mode detector 1110 according to various example embodiments may determine whether a specific test mode corresponding to the dedicated test pad has been entered based on the number of times of toggling of the test mode entry signal TME_s received through the control pin and/or the pattern of data received through the data input/output pin. Accordingly, the specific test mode corresponding to the dedicated test pad may be executed even when the dedicated test pad is not exposed to the outside.

FIG. 7 is a flowchart illustrating an example of an operation of the memory device 1100 of FIG. 5.

In operation S110, the memory device 1100 may receive at least one test mode entry signal from the external test device 1200 through at least one pin among a plurality of pins. Here, the test mode entry signal may be a signal requesting entry into a specific test mode corresponding to a dedicated test pad included in the memory device 1100. In this case, the number of times of toggling of the test mode entry signal and/or data pattern may be predetermined between the memory device 1100 and the test device 1200.

In operation S120, the memory device 1100 may determine whether the specific test mode of the memory device 1100 has been entered based on at least one test mode entry signal, and generate a test mode detection signal. For example, when the number of times of toggling of the test mode entry signal is equal to a particular (or, predetermined) number, the memory device 1100 may generate a test mode detection signal.

In operation S130, the memory device 1100 may electrically couple the dedicated test pad to a predetermined merged pin among the plurality of pins based on the test mode detection signal. Accordingly, a signal applied to the merged pin may be output to an output line of the dedicated test pad through the dedicated test pad.

In operation S140, the memory device 1100 may receive a test mode execution signal from the external test device 1200 through the merged pin and transmit the signal to the dedicated test pad. Accordingly, the memory device 1100 may perform a test operation of the specific test mode corresponding to the dedicated test pad.

Accordingly, even when the dedicated test pad is not exposed to the outside, the memory device 1100 may perform the test operation of the specific test mode corresponding to the dedicated test pad.

Figure 8:
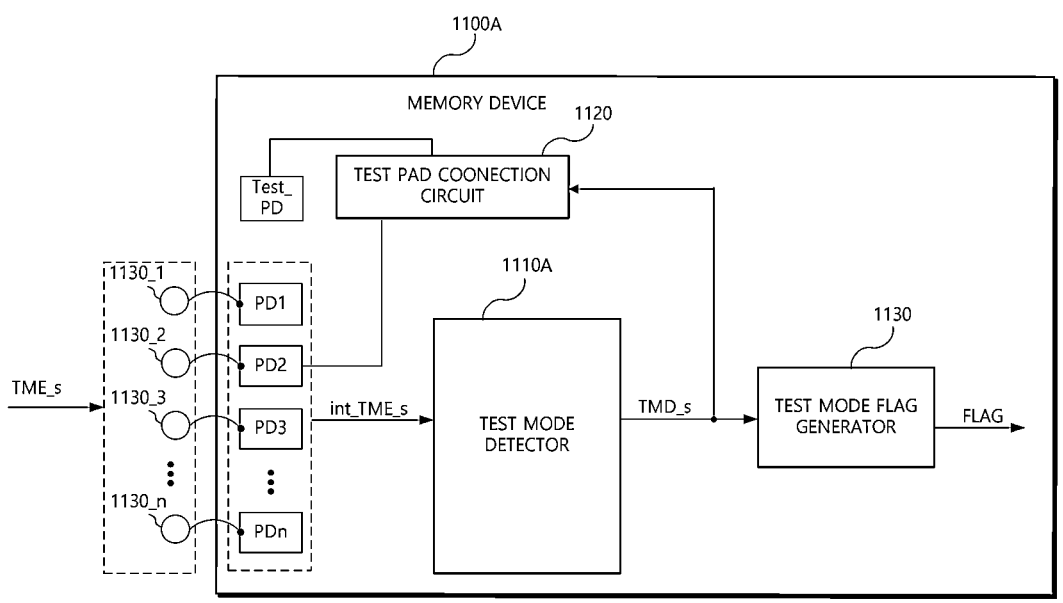
FIG. 8 is a diagram illustrating the memory device according to various example embodiments.

FIG. 8 is a diagram illustrating a memory device 1100A according to various example embodiments. The memory device 1100A of FIG. 8 is similar to the memory device 1100 of FIG. 5. Therefore, the same or similar components are denoted using the same or similar reference numerals, and duplicate descriptions will be omitted below.

The memory device 1100A of FIG. 8 may further include a test mode flag generator circuit, e.g. a test mode flag generator 1130. The test mode flag generator 1130 may generate a flag FLAG indicating that the memory device 1100A has entered a specific test mode.

In various example embodiments, a test mode detector 1110A may determine whether the specific test mode corresponding to the dedicated test pad Test_PD has been entered based on the test mode entry signal TME_s and/or a data pattern. When it is determined that the specific test mode has been entered, the test mode detector 1110A may transmit the test mode detection signal TMD_s to the test mode flag generator 1130. The test mode flag generator 1130 may generate the flag FLAG based on the test mode detection signal TMD_s.

In some example embodiments, the test pad connection circuit 1120 may generate a connection activation signal or a connection activation completion signal after the dedicated test pad Test_PD has been coupled to a merged pin. The test mode flag generator 1130 may generate the flag FLAG based on the test mode detection signal TMD_s and the connection activation signal.

While the memory device 1100A performs a test operation corresponding to the specific test mode, the flag FLAG may be maintained in an enabled state. While the flag FLAG is maintained in the enabled state, only the test operation of that specific test mode may be permitted. After the specific test operation has been completed, the flag FLAG may be disabled. As described above, the memory device 1100A according to various example embodiments may further include the test mode flag generator 1130, and the test mode flag generator 1130 may generate the flag FLAG after the specific test mode has been entered. Accordingly, a test operation of a specific test mode may be more smoothly performed without being disturbed by normal operations such as a read operation and a write operation.

Figure 9A:
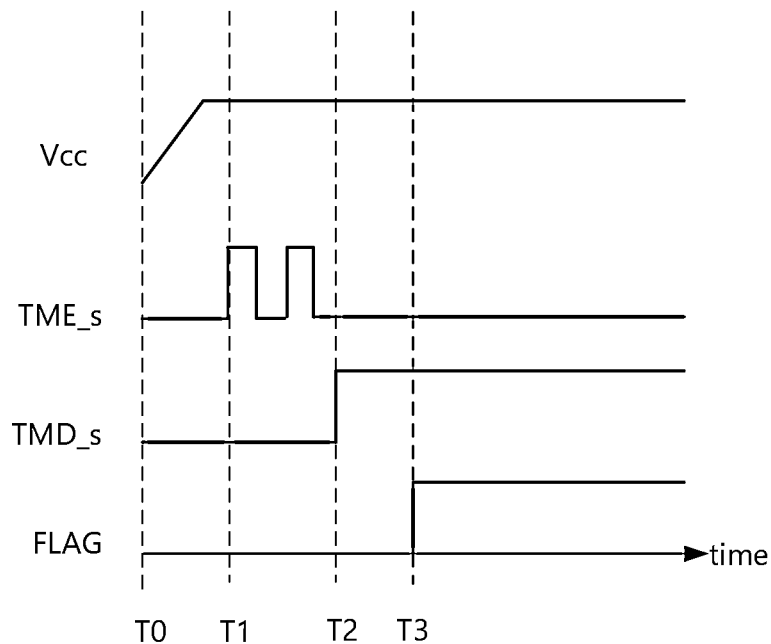
FIGS. 9A and 9B illustrate various example embodiments in which the memory device of FIG. 7 determines whether the memory device has entered a test mode based on a test mode entry signal input to one control pin.

FIG. 9A illustrates various example embodiments in which the memory device 1100A of FIG. 7 determines whether the memory device has entered a test mode based on a test mode entry signal input to one control pin. For convenience of description, it is assumed that the number of times of toggling of the test mode entry signal TME_s, which is a criterion for determining whether a specific test mode has been entered, is 'twice'.

First, referring to FIG. 9A, at time point T0, a power voltage Vcc for driving the memory device 1100A may be increased or ramped up. In various example embodiments, the power voltage Vcc of the memory device 1100A may be ramped up by applying a particular (or, predetermined) control signal from an external test device to the memory device 1100A.

At time point T1, when the level of the power voltage Vcc driving the memory device 1100A is stably maintained, the test mode entry signal TME_s may be applied to one of the plurality of pins 1130_1 to 1130_$n$ of the memory device 1100A from an external test device.

For example, one control pin to which the test mode entry signal TME_s is applied may be a merged pin configured to be coupled to the dedicated test pad Test_PD through the test pad connection circuit 1120. As another example, one control pin to which the test mode entry signal TME_s is applied may be one of control pins except the merged pin and may be a CE pin.

At time point T2, the test mode detector 1110A may determine whether the number of times of toggling of the test mode entry signal TME_s is equal to two, and when the number of times of toggling is equal to two, generate the test mode detection signal TMD_s. The test mode detection signal TMD_s may be transmitted to the test pad connection circuit 1120. The test pad connection circuit 1120 may transmit a signal received through the merged pin to an output line of the dedicated test pad Test_PD based on the test mode detection signal TMD_s. It is illustrated in FIG. 9A that the test mode detection signal TMD_s having a logic high level is generated when it is detected that the test mode has been entered, but is not limited thereto. For example, when it is detected that the test mode has been entered, the test mode detection signal TMD_s having a logic low level may be generated. In this case, the test pad connection circuit 1120 may transmit a signal received through the merged pin to the output line of the dedicated test pad Test_PD when the test mode detection signal TMD_s is at logic low level.

At time point T3, the test mode flag generator 1130 may generate a flag FLAG indicating that the memory device 1100A has entered the test mode in response to the test mode detection signal TMD_s.

Figure 9B:
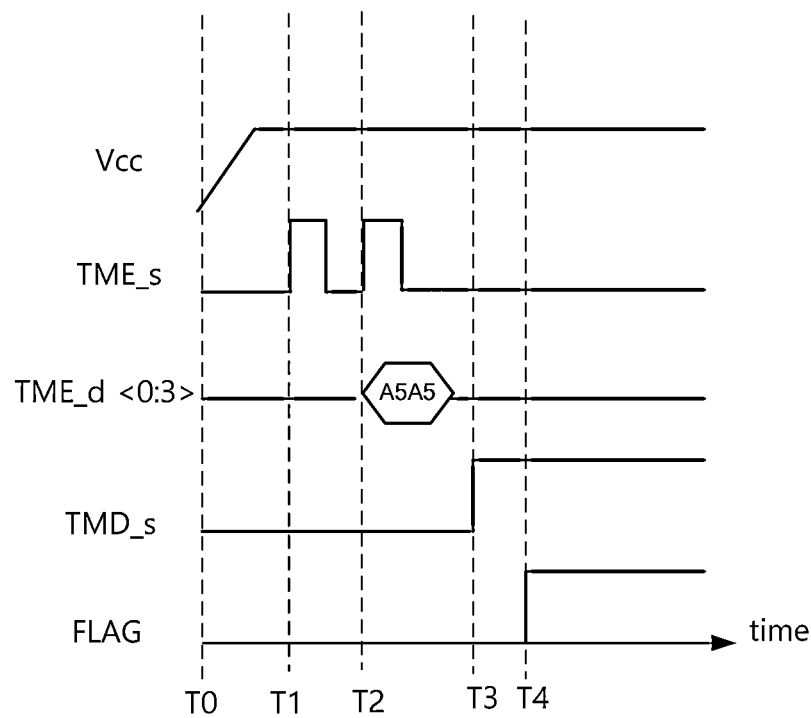

FIG. 9B illustrates various example embodiments in which the memory device 1100A of FIG. 7 determines whether a test mode has been entered based on a test mode entry signal and the pattern of data input to a data input/output pin. For convenience of description, it is assumed that the number of times of toggling of the test mode entry signal TME_s, which is a criterion for determining whether a specific test mode has been entered, is 'twice'. In addition, it is assumed that the pattern of data that is the criterion for determining whether a specific test mode has been entered is 'A5A5' as lower 4 bits of data.

Referring to FIG. 9B, whether the test mode has been entered may be determined based on the pattern of data (TM_d<0:3>) as well as the test mode entry signal TME_s.

At time point T0, the power voltage Vcc for driving the memory device 1100A may be ramped up.

At time point T1, the test mode entry signal TME_s may be applied from an external test device to the plurality of pins 1130_1 to 1130_n of the memory device 1100A.

At time point T2, data may be input through the data input/output pin. For example, data may be input through a data input/output pin at a rising edge of the second toggle of the test mode entry signal TME_s.

At time point T3, the test mode detector 1110 may determine whether the number of times of toggling of the test mode entry signal TME_s has reached twice that is a predetermined number of times. In addition, the test mode detector 1110 may determine whether the pattern of the lower 4 bits of data received through the data input/output pin is 'A5A5'. When the number of times of toggling and the pattern of data are the same as a particular (or, predetermined) number and a particular (or, predetermined) pattern, the test mode detector 1110 may determine to enter a specific test mode and generate the test mode detection signal TMD_s.

At time point T4, the test mode flag generator 1130 may generate a flag FLAG indicating that the memory device 1100A has entered the test mode in response to the test mode detection signal TMD_s.

FIG. 10 is a flowchart illustrating an example of an operation of the memory device 1100A of FIG. 8. For convenience of description, it is assumed in FIG. 10 that whether a specific test mode has been entered is determined based on the number of times of toggling of the test mode entry signal.

In operation S210, the memory device 1100A may receive at least one test mode entry signal from the external test device 1200 through at least one pin among a plurality of pins.

In operation S220, the memory device 1100A may determine whether the specific test mode of the memory device 1100 has been entered based on at least one test mode entry signal, and generate a test mode detection signal.

In operation S230, the memory device 1100A may electrically couple the dedicated test pad to a predetermined merged pin among the plurality of pins based on the test mode detection signal.

In operation S235, the memory device 1100A may generate a flag indicating that the memory device has entered the specific test mode based on the test mode detection signal.

In operation S240, the memory device 1100A may receive a test mode execution signal from the external test device 1200 through the merged pin and transmit the signal to the dedicated test pad. Accordingly, the memory device 1100A may perform a test operation of the specific test mode corresponding to the dedicated test pad.

Meanwhile, it is illustrated in FIG. 10 that a flag is generated after the memory device 1100A has electrically coupled a dedicated test pad for a test mode to a merged pin among a plurality of pins. However, this is merely an example, and the operation of generating the flag may be performed substantially simultaneously with the operation of coupling the merged pin.

As described above, the memory device 1100A according to various example embodiments may not only execute a specific test mode but also perform the test operation of a specific test mode more smoothly without being interfered with normal operations such as read and write operations even when the dedicated test pad Test_PD is not exposed.

Figure 11:
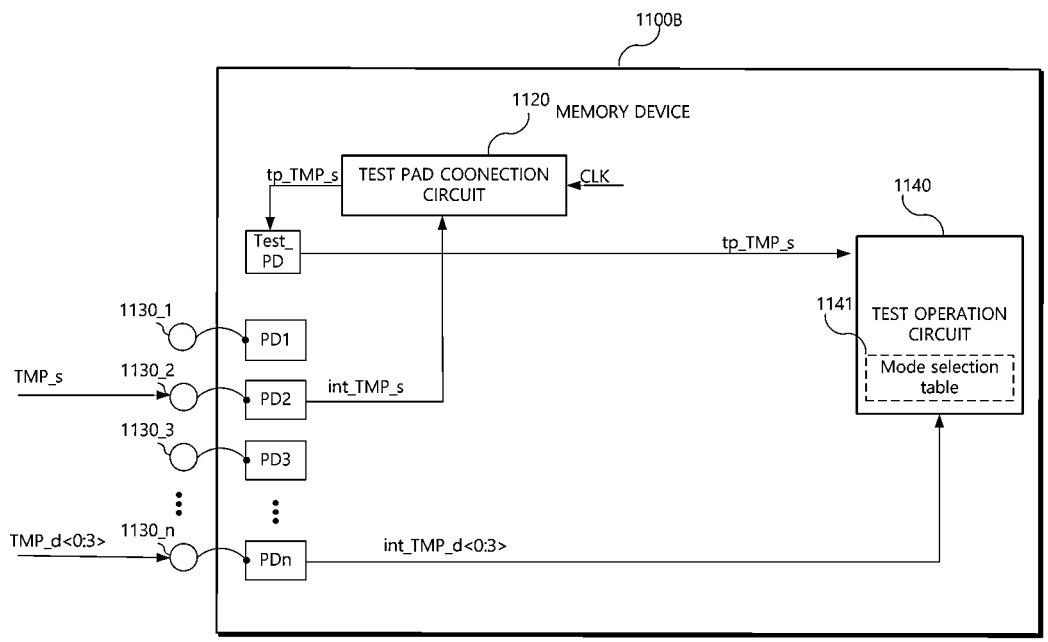
FIG. 11 is a diagram for describing an example of performing a specific test mode of the memory device according to various example embodiments.

FIG. 11 is a diagram for describing an example of performing a specific test mode of a memory device 1100B according to various example embodiments. For brief description, configurations related to execution of a specific test mode are merely shown in FIG. 11, and other configurations will be omitted. Also, descriptions overlapping those of the memory device 1100A of FIG. 8 will be omitted below.

Referring to FIG. 11, the memory device 1100B of FIG. 11 may further include a test operation circuit 1140. Although it is illustrated in FIG. 11 that the test operation circuit 1140 is provided as a separate component for convenience of description, example embodiments are not limited thereto, and the test operation circuit 1140 may be integrated into a control circuit for controlling a memory array in the memory device 1100B.

When the merged pin 1130_2 and the dedicated test pad Test_PD are coupled by the test pad connection circuit 1120, the test operation of a specific test mode corresponding to the dedicated test pad Test_PD may be performed.

The memory device 1100B may receive a test mode execution signal TMP_s from an external test device through the merged pin 1130_2, and receive test mode execution data TMP_d<0:3> through a data input/output pin. The test mode execution signal TMP_s may be a signal related to execution of the specific test mode. The test mode execution data TMP_d<0:3> may be data related to the execution of the test mode, and may include an address, a command, data, and the like. Although it is illustrated in FIG. 11 that the test mode execution data TMP_d<0:3> is lower 4 bits of data received through the data input/output pin, but is not limited thereto. For example, the test mode execution data TMP_d<0:3> may be upper 4 bits or may be composed of different bits.

The test mode execution signal TMP_s may be transferred to an internal pad PD2 coupled to the merged pin 1130_2. The internal pad PD2 may transmit the received test mode execution signal TMP_s to the test pad connection circuit 1120 as an internal test mode execution signal int_TMP_s. In this case, the test mode execution signal TMP_s and the internal test mode execution signal int_TMP_s may be the same.

The internal test mode execution signal int_TMP_s may be transferred to the dedicated test pad Test_PD by the test pad connection circuit 1120. The test pad connection circuit 1120 may transfer the internal test mode execution signal int_TMP_s to the dedicated test pad Test_PD during a period in which the test mode detection signal is activated such that the internal test mode execution signal int_TMP_s is transferred to the test operation circuit 1140 through the output line of the dedicated test pad Test_PD.

In some example embodiments, the test pad connection circuit 1120 may synchronize the internal test mode execution signal int_TMP_s with a clock signal CLK and transmit the internal test mode execution signal int_TMP_s to the dedicated test pad Test_PD. For example, the clock signal CLK input to the test pad connection circuit 1120 may be a clock signal received from an external test device, or may be generated by the memory device 1100B based on a clock signal received from an external test device. The synchronized test mode execution signal tp_TMP_s may be transferred to the test operation circuit 1140.

The test mode execution data TMP_d<0:3> may be transferred to an internal pad PDn coupled to the data input/output pin 1130_n. The internal pad PDn may transfer the received test mode execution data TMP_d<0:3> to the test operation circuit 1140 as an internal test mode execution data int_TMP_d<0:3> signal. In this case, the test mode execution data TMP_d<0:3> and the internal test mode execution data int_TMP_d<0:3> may be the same.

The test operation circuit 1140 may perform a test operation based on the synchronized test mode execution signal tp_TMP_s and the internal test mode execution data int_TMP_d<0,3> which may be synchronized with each other.

In general, when a test operation is performed, a plurality of control signals for a test operation of the memory device may be received from a plurality of pins or pads to perform the test operation. For example, the plurality of control signals may include one or more of a Command Latch Enable (CLE) signal, an Address Latch Enable (ALE) signal, a Write Enable (WE) signal, a Read Enable (RE) signal, a Write Protection (WP) signal or the like. To apply the control signals, it may be necessary or desirable to configure a test environment by coupling a plurality of pins corresponding to the plurality of control signals to a test device through probes, in addition to a data input/output pin for inputting test data. As the number of pins to be coupled to the test device increases, the test time increases along with the increase in cost.

On the other hand, the memory device 1100B according to various example embodiments may use the test mode execution signal TMP_s transmitted from the dedicated test pad Test_PD and the test mode execution data int_TMP_d<0,3>, resulting in reduction in the number of pins used when performing tests.

Specifically, the test operation circuit 1140 may replace control signals corresponding to pins other than the merged pin 1130_2 among the plurality of pins 1130_1 to 1130_n based on the test mode execution data int_TMP_d<0:3> received through the data input/output pin 1130_n during the period of toggling of the test mode execution signal TMP_s. Here, the plurality of control signals may be, for example, a CLE signal, an ALE signal, a WE signal, an RE signal, or a WP signal.

In some example embodiments, the test operation circuit 1140 may include a mode selection table 1141 defining a relationship, e.g. a matching relationship, between a pattern of the test mode execution data int_TMP_d<0:3> and one or more modes related to the functions of a control signal to be replaced. Here, the mode related to the function of the control signal to be replaced may include a CLE mode related to the CLE signal, an ALE mode related to the ALE signal, a data input mode related to the WE signal, a data output mode related to the RE signal or the like. The mode selection table 1141 may be managed as a table by matching the CLE mode, the ALE mode, the data input mode, and the data output mode with first to fourth patterns respectively corresponding thereto.

The test operation circuit 1140 may enable a mode corresponding to the test mode execution data int_TMP_d<0:3> based on the mode selection table 1141 and then perform a test operation using data input to an input/output data pin. In this case, to distinguish between data used to select a mode from an address, a command, or page data used during test execution, the data used to select a mode may be referred to as a mode selection data.

As described above, in the memory device 1100B according to various example embodiments, a specific test mode corresponding to the dedicated test pad Test_PD may be executed even when the dedicated test pad is not exposed to the outside of the memory device 1100B. In addition, control signals corresponding to pins other than the merged pin 1130_2 among the plurality of pins 1130_1 to 1130_n may be replaced based on the test mode execution data int_TMP_d<0:3> received through the data input/output pins 1130_n during the period of the toggling of the test mode execution signal TMP_s. Accordingly, the number of pins to be used during tests may be reduced, thereby reducing test cost and/or test time.

Figure 12A:
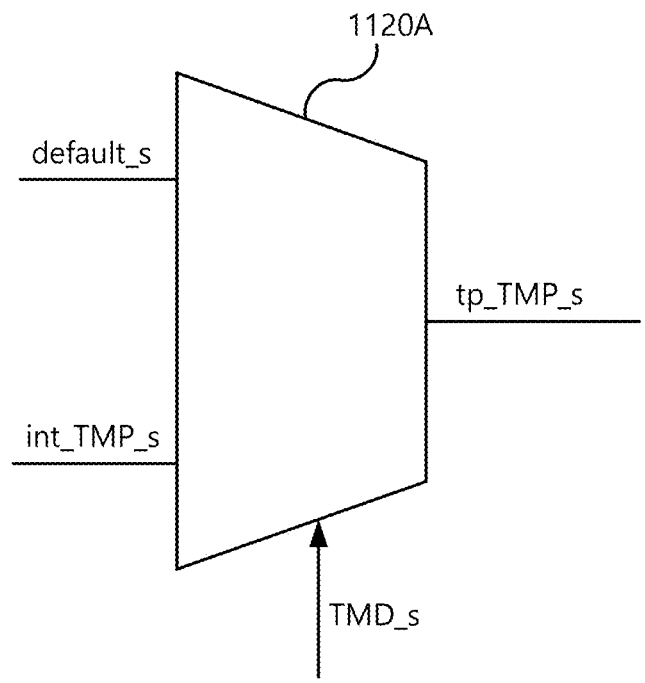
FIG. 12A is a diagram illustrating various example embodiments of a test pad connection circuit of FIG. 11.

FIG. 12A is a diagram illustrating various example embodiments of a test pad connection circuit of FIG. 11.

Referring to FIG. 12A, a test pad connection circuit 1120A may output a default signal default_s or the internal test mode execution signal int_TMP_s transmitted from the merged pin based on the test mode detection signal TMD_s.

For example, when it is detected that the test mode has been entered and the test mode detection signal TMD_s is activated, the test pad connection circuit 1120A may select the internal test mode execution signal int_TMP_s and output the internal test mode execution signal int_TMP_s as an output signal tp_TMP_s. As another example, when the test mode detection signal TMD_s is deactivated because it is not detected that the test mode has been entered, the test pad connection circuit 1120A may select the default signal default_s and output the default signal default_s as the output signal tp_TMP_s. The signal tp_TMP_s output from the test pad connection circuit 1120A may be transferred to the output line of the dedicated test pad Test_PD and provided to the test operation circuit 1140. For example, when the output signal tp_TMP_s transmitted to the test operation circuit 1140 is the internal test mode execution signal int_TMP_s received from the merged pin, the test operation circuit 1140 may perform a test operation corresponding to the internal test mode execution signal int_TMP_s. As another example, when the signal tp_TMP_s transmitted to the test operation circuit 1140 is the default signal default_s, the test operation circuit 1140 may ignore the default signal default_s. For example, the test operation circuit 1140 may not perform a test operation.

Figure 12B:
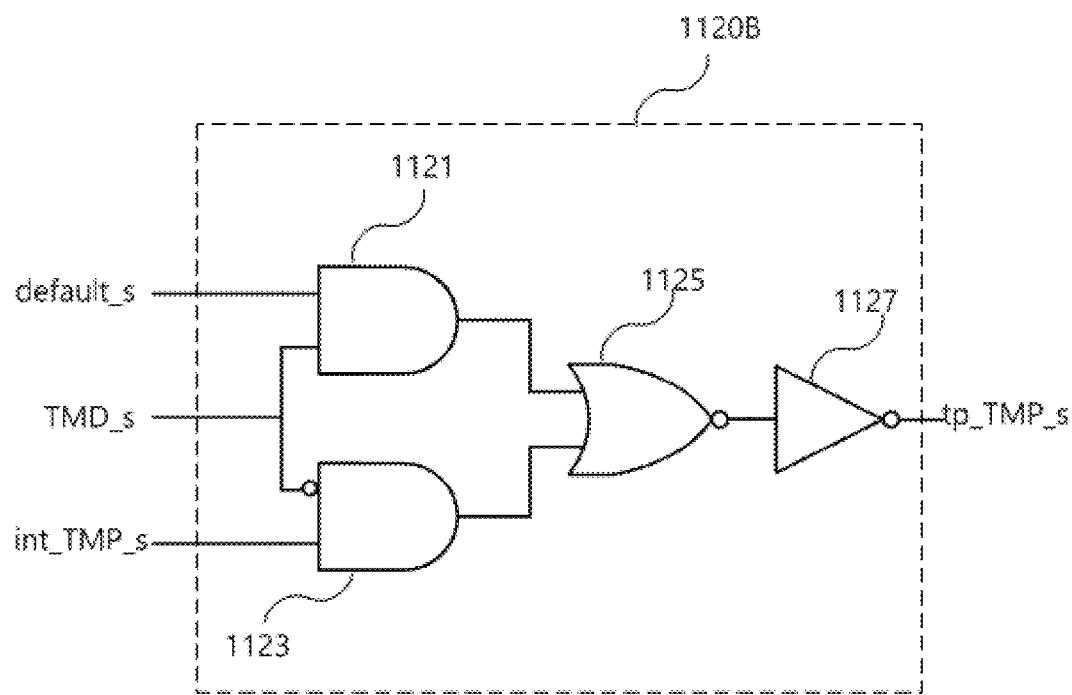
FIG. 12B is a diagram illustrating an example of a logic circuit implementing the test pad connection circuit of FIG. 11.

FIG. 12B is a diagram illustrating an example of a logic circuit implementing the test pad connection circuit of FIG. 11. For convenience of description, it may be assumed that the test mode detection signal TMD_s is activated at a logic low level when it is detected that the test mode has been entered.

Referring to FIG. 12B, a test pad connection circuit 1120B may include AND gates 1121 and 1123, a NOR gate 1125, and an inverter 1127.

When the test mode detection signal TMD_s is at logic high level, that is, when it is not detected that the test mode has been entered, the output value of the AND gate 1123 may be or may correspond to logical "0", and the output of the AND gate 1121 may have a value corresponding to the default signal default_s. The output value of the AND gate 1121 may be finally output through the NOR gate 1125 and the inverter 1127. Accordingly, the test pad connection circuit 1120B may have an output value corresponding to the default signal default_s.

On the other hand, when the test mode detection signal TMD_s is at logic low level, that is, when it is detected that the test mode has been entered, the test pad connection circuit 1120B may have an output value corresponding to the internal test mode execution signal int_TMP_s.

As described with reference to FIGS. 12A and 12B, when it is detected that the test mode has been entered, the test pad connection circuit 1120A according to various example embodiments may transmit a test mode execution signal received through the merged pin to the output line of the dedicated test pad. Accordingly, even when the dedicated test pad is not exposed, a test operation corresponding to a specific test mode may be performed.

Figure 13A:
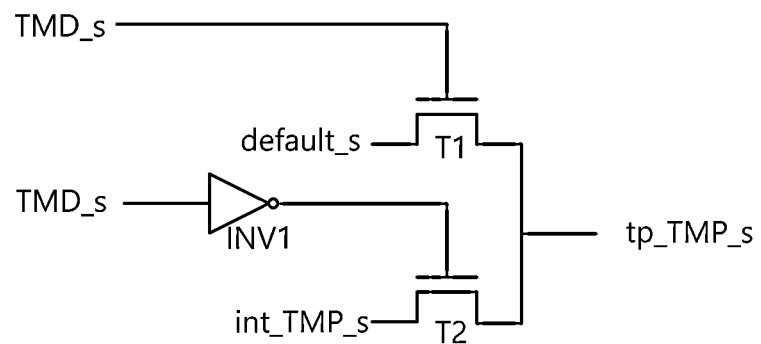
FIG. 13A is an example of implementing the test pad connection circuit of FIG. 12B.
Figure 13B:
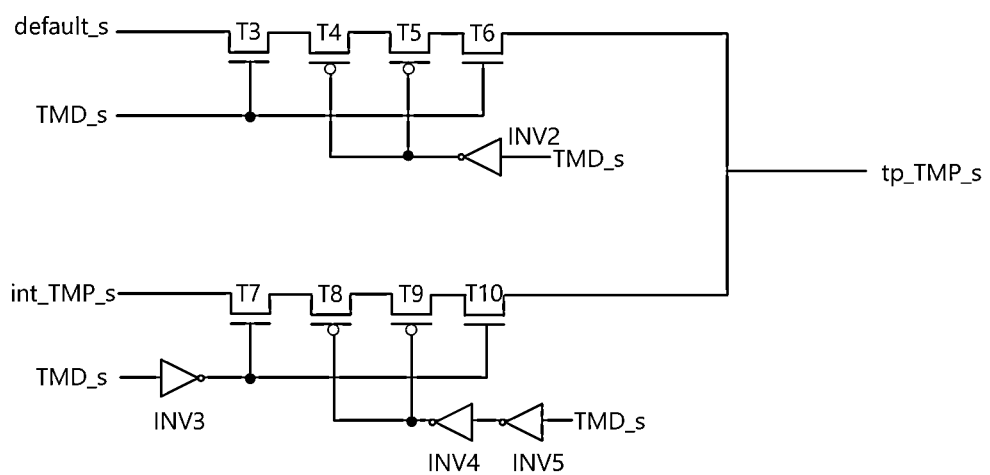
FIG. 13B is another example of implementing the test pad connection circuit of FIG. 12B.

FIG. 13A is an example of implementing the test pad connection circuit of FIG. 12B, and FIG. 13B is another example of implementing the test pad connection circuit of FIG. 12B. For convenience of description, it is assumed that the test mode detection signal TMD_s is activated at logic low level when it is detected that the test mode has been entered.

Referring to FIG. 13A, a test pad connection circuit 1120C may include first and second transistors T1 and T2 and a first inverter INV1. For example, as shown in FIG. 13A, the first and second transistors T1 and T2 may be NMOS transistors. However, this is an example, and is not limited thereto.

The first transistor T1 may be turned on in response to the test mode detection signal TMD_s. When the first transistor T1 is turned on, the default signal default_s may output as the output signal tp_TMP_s of the test pad connection circuit 1120C.

The inverter INV1 may invert and output the test mode detection signal TMD_s. The second transistor T2 may be turned on in response to an output value of the first inverter INV1. When the second transistor T2 is turned on, the internal test mode execution signal int_TMP_s may be output as the output signal tp_TMP_s of the test pad connection circuit 1120C.

In the test pad connection circuit 1120C according to various example embodiments, a signal input from a test device to a merged pin may have a relatively low voltage level.

Referring to FIG. 13B, a test pad connection circuit 1120D may include third to tenth transistors T3 to T10 and second to fourth inverters INV2 to INV5. As shown in FIG. 13B, the fourth, fifth, eighth, and ninth transistors T4, T5, T8, and T9 may be PMOS transistors, and the third, sixth, seventh, and tenth transistors T2, T6, T7, and T10 may be NMOS transistors. However, this is merely example, and the present disclosure is not limited thereto.

When the test mode detection signal TMD_s is at logic high level, the third to sixth transistors T3 to T6 are turned on, and the default signal default_s may be output as the output signal tp_TMP_s of the test pad connection circuit 1120D.

When the test mode detection signal TMD_s is at logic low level, the seventh to tenth transistors T7 to T10 are turned on, and the internal test mode execution signal int_TMP_s may be output as the output signal tp_TMP_s of the test pad connection circuit 1120D.

In the test pad connection circuit 1120D according to various example embodiments, a signal input from a test device to a merged pin may have a relatively high voltage level.

Figure 14:
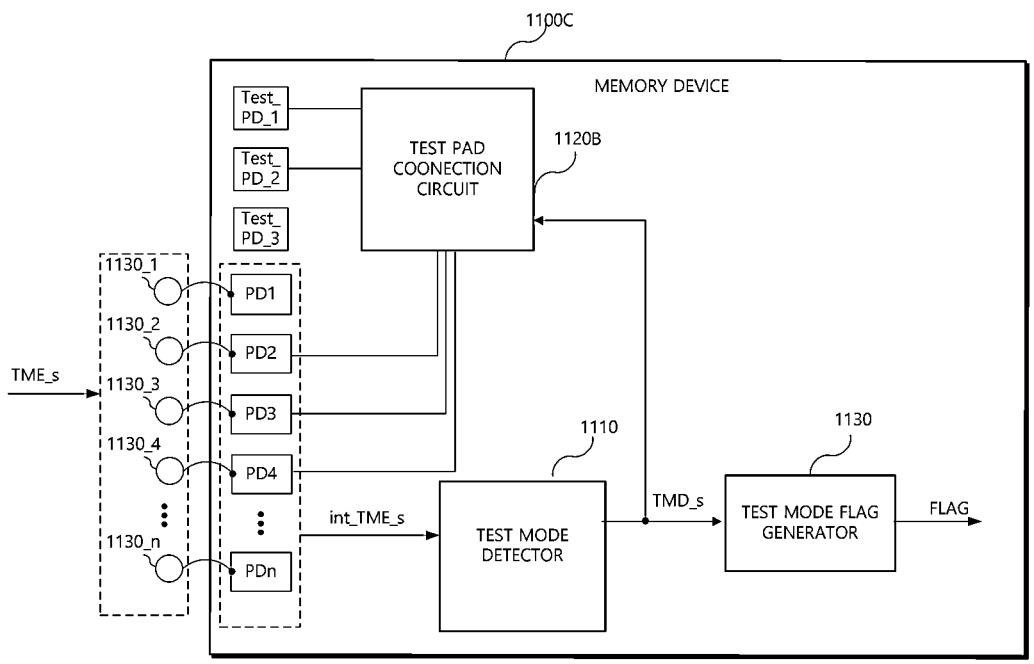
FIG. 14 is a diagram illustrating a memory device according to another embodiment of the present disclosure.

FIG. 14 is a diagram illustrating a memory device 1100C according to another embodiment of the present disclosure.

The memory device 1100C of FIG. 14 may have a different configuration from the memory device 1100B of FIG. 7 in that pins and test pads are coupled through a test pad connection circuit. A description overlapping with that of the memory device of FIG. 7 will be omitted below.

The memory device 1100C of FIG. 14 may detect whether the test mode has been entered based on the test mode entry signal TME_s received through at least one of a plurality of pins 1130_1-1130_n, and generate the test mode detection signal TMD_s.

The test pad connection circuit 1120B may couple a plurality of dedicated test pads Test_PD1 to Test_PD3 to corresponding pins among the plurality of pins, respectively, based on the test mode detection signal TMD_s. The pins predetermined to be respectively coupled to the plurality of dedicated test pads Test_PD1 to Test_PD3 may be referred to as merged pins. Although it is illustrated in FIG. 14 that three dedicated test pads Test_PD1 to Test_PD3 are coupled to three merged pins 1130_2 to 1130_4, respectively, the present disclosure is not limited thereto. Three or more dedicated test pads and merged pins may be coupled correspondingly.

In some example embodiments, the plurality of dedicated test pads Test_PD1 to Test_PD3 may be test pads for measuring various voltage levels used in a semiconductor device.

In general, a test may be performed by directly coupling dedicated test pads for measuring various voltage levels used in a semiconductor device to an external tester through probes and applying a test signal. However, when a test signal cannot be received from an external device because the dedicated test pads are molded and are not exposed to the outside of the memory device, the corresponding test operation cannot be performed. In some example embodiments, the memory device 1100C may be in a state in which a packaging process has been completed, but is not limited thereto. Although the memory device 1100C is in the package level, the embodiment of the present disclosure may be applied when the dedicated test pad is not exposed.

However, in various example embodiments, even when dedicated test pads for measuring various voltage levels inside the memory device 1100C are not exposed to the outside, signals received from a test device through the plurality of merged pins are transmitted to a plurality of dedicated test pads corresponding thereto, thus performing specific test mode operations corresponding to the dedicated test pads, for example, internal voltage level measurement operations.

Meanwhile, various example embodiments have been described above. In addition to the above-described example embodiments, inventive concepts will also include embodiments that can be simply and/or easily changed in design. In addition, example embodiments also include techniques that can be easily modified and practiced. Therefore, the scope should not be limited to the above-described embodiments, and should be defined by those equivalent to the claims of the present disclosure as well as the claims to be described later.

The memory device according to various example embodiments may enter a test mode corresponding to a dedicated test pad through a pin exposed to the outside even when the dedicated test pad is not exposed to the outside, and perform a test operation in a corresponding test mode by receiving a test execution signal via a pin coupled to the dedicated test pad.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

While various features have been described with reference to various example embodiments, it will be apparent to those of ordinary skill in the art that various changes and modifications may be made thereto without departing from the spirit and scope as set forth in the following claims. Furthermore example embodiments are not necessarily mutually exclusive with one another. For example, some example embodiments may include one or more features described with reference to one or more drawings, and may also include one or more other features described with reference to one or more other drawings.

What is claimed is:

1. A memory device for receiving a signal from an external device through a plurality of pins, comprising:
a test mode detector circuit configured to determine whether the memory device has entered a test mode based on at least one test mode entry signal received through at least one pin of the plurality of pins and to generate a test mode detection signal; and
a test pad connection circuit configured to electrically couple a first pin of the plurality of pins to a dedicated test pad corresponding to the test mode such that a signal applied to the first pin is transmitted to the dedicated test pad based on the test mode detection signal, wherein the test pad is covered by an insulating layer.

2. The memory device of claim 1, wherein the memory device is configured to have a test mode execution signal applied through the first pin transmitted to the dedicated test pad and to perform a test operation corresponding to the test mode signal, after the dedicated test pad and the first pin are electrically coupled.

3. The memory device of claim 2, further comprising:
a test mode flag generator circuit configured to generate a flag indicating that the memory device has entered the test mode, based on the test mode detection signal.

4. The memory device of claim 1, wherein the at least one pin of the plurality of pins is the first pin.

5. The memory device of claim 1, wherein the at least one pin of the plurality of pins is a control pin configured to receive a control signal of the memory device and is different from the first pin.

6. The memory device of claim 1, wherein
the at least one pin is a control pin configured to receive a control signal of the memory device, and
the test mode detector circuit is configured to determine whether the test mode has been entered based on the test mode entry signal and a pattern of data received through a data input/output pin among the plurality of pins.

7. The memory device of claim 4, wherein
the test mode detector circuit includes a counter configured to count a number of times of toggling of the test mode entry signal, and
the test mode detector circuit is configured to generate the test mode detection signal based on whether the number of times of the toggling is equal to a number "n" ("n" is a natural number greater than or equal to one).

8. The memory device of claim 3, wherein
the test pad connection circuit is configured to generate a connection activation completion signal after the dedicated test pad has been coupled to the first pin, and
the test mode flag generator circuit is configured to generate the flag based on the connection activation completion signal and the test mode detection signal.

9. The memory device of claim 3, wherein the test mode flag generator circuit is configured to enable the flag while a test operation corresponding to the test mode execution signal is performed, and the test mode flag generator circuit is configured to disable the flag upon the test operation being finished.

10. The memory device of claim 2, wherein the memory device is configured to have control signals corresponding to remaining pins other than the first pin among the plurality of pins replaced using a pattern of data received through a data input/output pin among the plurality of pins during a period of toggling of the test mode execution signal transferred to the dedicated test pad and upon a test operation corresponding to the test mode execution signal being performed.

11. The memory device of claim 10, further comprising:
a memory configured to store a mode selection table defining a matching relationship between patterns of the data and modes related to functions of the control signals corresponding to the remaining pins, wherein the memory is configured to have a mode corresponding to the pattern of the data enabled based on the mode selection table.

12. A test method performed in a memory device that receives a signal from an external test device through a plurality of pins, comprising:
   receiving, from the external test device, at least one test mode entry signal through at least one pin of the plurality of pins;
   generating a test mode detection signal by determining whether the memory device has entered a test mode based on the at least one test mode entry signal;
   electrically coupling a dedicated test pad corresponding to the test mode, to a first pin among the plurality of pins, based on the test mode detection signal, wherein the dedicated test pad is covered by an insulating layer; and
   performing a test operation corresponding to the test mode signal based on a test mode execution signal transmitted from the external test device to the dedicated test pad through the first pin.

13. The test method of claim 12, further comprising:
   generating a flag indicating that the memory device has entered the test mode, based on the test mode detection signal and after the test mode detection signal is generated.

14. The test method of claim 12, wherein the plurality of pins include at least one control pin configured to receive a control signal from the external test device and at least one data input/output pin configured to receive data from the external test device.

15. The test method of claim 12, wherein the at least one pin among the plurality of pins is the first pin.

16. The test method of claim 14, wherein
   the at least one pin is a part of the at least one control pin, and
   the generating of the test mode detection signal includes determining whether the test mode has been entered based on the test mode entry signal and data received through the data input/output pin.

17. The test method of claim 15, wherein the generating of the test mode detection signal includes generating the test mode detection signal based on whether a number of times of toggling of the test mode entry signal is equal to a number "n" ("n" is a natural number greater than or equal to one).

18. The test method of claim 14, wherein control signals corresponding to remaining pins other than the first pin among the at least one control pin are replaced using a pattern of data received through a data input/output pin among the plurality of pins during a period of toggling of the test mode execution signal transferred to the dedicated test pad and upon a test operation corresponding to the test mode execution signal being performed.

19. A semiconductor device for receiving a signal from an external test device through a plurality of pins and performing a test, comprising:
   processing circuitry configured to execute machine-readable instructions that, when executed by the processing circuitry, cause the semiconductor device to determine whether the semiconductor device has entered a test mode based on at least one test mode entry signal received from the external test device through at least one of the plurality of pins, and to electrically couple a plurality of dedicated test pads corresponding to the test mode to corresponding pins among the plurality of pins, respectively upon determining that the semiconductor device has entered the test mode,
   wherein the plurality of dedicated test pads are covered by an insulating layer and are not exposed to outside of the semiconductor device.

20. The semiconductor device of claim 19, wherein the semiconductor device is configured to perform a test operation corresponding to a test mode execution signal based on the test mode execution signal transmitted from the external test device to each of the plurality of dedicated test pads through the corresponding pins, after the plurality of dedicated test pads and the corresponding pins are electrically coupled.

* * * * *